United States Patent
Yeo et al.

(10) Patent No.: US 6,911,379 B2
(45) Date of Patent: Jun. 28, 2005

(54) METHOD OF FORMING STRAINED SILICON ON INSULATOR SUBSTRATE

(75) Inventors: Yee-Chia Yeo, Hsin-Chu (TW); Wen-Chin Lee, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 10/379,873

(22) Filed: Mar. 5, 2003

(65) Prior Publication Data

US 2004/0173790 A1 Sep. 9, 2004

(51) Int. Cl.[7] .......................... H10L 21/20; H10L 21/36
(52) U.S. Cl. ..................................................... 438/480
(58) Field of Search ........................................ 438/480

(56) References Cited

U.S. PATENT DOCUMENTS

| | | |
|---|---|---|
| 4,072,974 A | 2/1978 | Ipri |
| 5,013,681 A | 5/1991 | Godbey et al. |
| 5,024,723 A | 6/1991 | Goesele et al. |
| 5,213,986 A | 5/1993 | Pinker et al. |
| 5,374,564 A | 12/1994 | Bruel |
| 5,468,657 A | 11/1995 | Hsu |
| 5,633,588 A | 5/1997 | Hommei et al. |
| 5,659,192 A | 8/1997 | Sarma et al. |
| 5,663,588 A | 9/1997 | Suzuki et al. |
| 5,739,574 A | 4/1998 | Nakamura |
| 5,759,898 A | 6/1998 | Ek et al. |
| 5,769,991 A | 6/1998 | Miyazawa et al. |
| 5,792,669 A | 8/1998 | Baumann et al. |
| 5,863,830 A | 1/1999 | Bruel et al. |
| 5,882,981 A | 3/1999 | Rajgopal et al. |
| 5,882,987 A | 3/1999 | Srikrishnan |
| 5,904,539 A | 5/1999 | Hause et al. |
| 6,023,082 A * | 2/2000 | McKee et al. ............... 257/295 |
| 6,143,070 A | 11/2000 | Bliss et al. |
| 6,159,824 A | 12/2000 | Henley et al. |

(Continued)

FOREIGN PATENT DOCUMENTS

| | | |
|---|---|---|
| JP | 2003229577 | 8/2003 |
| JP | 2003289144 | 10/2003 |

OTHER PUBLICATIONS

Wolf and Tauber "Silicon Processing for the VLSI Era vol. 1 : Process Technology"; pp. 191, 194 and 195; Lattice Press, 1986; Sunset Beach, CA.*
Nanocleaving: An Enabling Technology for Ultra–thin SOI; Silicon Genesis Corporation; 2002; Japan Society of Applied Physics; pp 97–102.*
Current, M.I., et al., "Atomic–Layer Cleaving and Non–Contact Thinning and Thickening for Fabrication of Laminated Electronic and Photonic Materials," 2001 Materials Research Society Spring Meeting (Apr. 16–20, 2001).
Current, M.I., et al., "Atomic–layer Cleaving with $Si_xGe_y$ Strain Layers for Fabrication of Si and Ge–rich SOI Device Layers," 2001 IEEE SOI Conference (Oct. 1–4, 2001) pp. 11–12.

(Continued)

*Primary Examiner*—George Fourson
*Assistant Examiner*—Fernando L. Toledo
(74) *Attorney, Agent, or Firm*—Slater & Matsil, L.L.P.

(57) ABSTRACT

A method of forming a strained-silicon-on-insulator substrate is disclosed. A target wafer includes an insulator layer on a substrate. A donor wafer includes a bulk semiconductor substrate having a lattice constant different from a lattice constant of silicon and a strained silicon layer formed on the bulk semiconductor substrate. The top surface of the donor wafer is bonded to the top surface of the target wafer. The strained silicon layer is then separated from the donor wafer so that the strained silicon layer adheres to the target wafer. The bond between the strained silicon layer and the target wafer can then be strengthened.

84 Claims, 6 Drawing Sheets

U.S. PATENT DOCUMENTS

| | | |
|---|---|---|
| 6,207,005 B1 | 3/2001 | Henley et al. |
| 6,252,284 B1 | 6/2001 | Muller et al. |
| 6,291,321 B1 | 9/2001 | Fitzgerald |
| 6,326,285 B1 | 12/2001 | Behfar et al. |
| 6,335,231 B1 | 1/2002 | Yamazaki et al. |
| 6,355,541 B1 | 3/2002 | Holland et al. |
| 6,358,806 B1 | 3/2002 | Puchner |
| 6,368,938 B1 | 4/2002 | Usenko |
| 6,407,406 B1 | 6/2002 | Tezuka |
| 6,410,371 B1 | 6/2002 | Yu et al. |
| 6,410,938 B1 | 6/2002 | Xiang |
| 6,429,061 B1 | 8/2002 | Rim |
| 6,455,398 B1 | 9/2002 | Fonstad, Jr. et al. |
| 6,486,008 B1 | 11/2002 | Lee |
| 6,497,763 B2 * | 12/2002 | Kub et al. ............... 117/94 |
| 6,534,380 B1 * | 3/2003 | Yamauchi et al. ......... 438/455 |
| 6,534,382 B1 * | 3/2003 | Sakaguchi et al. ......... 438/455 |
| 6,562,703 B1 * | 5/2003 | Maa et al. ............... 438/518 |
| 6,603,156 B2 * | 8/2003 | Rim ....................... 257/190 |
| 6,649,492 B2 | 11/2003 | Chu et al. |
| 6,661,065 B2 | 12/2003 | Kunikiyo |
| 6,670,677 B2 | 12/2003 | Choe et al. |
| 6,690,043 B1 | 2/2004 | Usuda et al. |
| 2001/0001490 A1 * | 5/2001 | Sung et al. ............... 257/316 |
| 2002/0125475 A1 | 9/2002 | Chu et al. |
| 2002/0140031 A1 | 10/2002 | Rim |
| 2002/0185684 A1 | 12/2002 | Campbell et al. |
| 2003/0013305 A1 | 1/2003 | Sugii et al. |
| 2003/0080384 A1 * | 5/2003 | Takahashi et al. ......... 257/347 |
| 2003/0104287 A1 | 6/2003 | Yuasa |
| 2003/0227057 A1 | 12/2003 | Lochtefeld et al. |

OTHER PUBLICATIONS

Langdo, T.A., et al., "Preparation of Novel SiGe–Free Strained Si on Insulator Substrates," 2002 IEEE International SOI Conference (Aug. 2002) pp. 211–212.

Mizuno, T., et al., "Novel SOI p–Channel MOSFETs With Higher Strain in Si Channel Using Double SiGe Heterostructures," IEEE Transactions on Electron Devices, vol. 49, No. 1 (Jan. 2002) pp. 7–14.

* cited by examiner

METHOD OF FORMING STRAINED SILICON ON INSULATOR SUBSTRATE

TECHNICAL FIELD

The present invention relates generally to integrated circuits, and more particularly to a method of forming a strained silicon-on-insulator substrate.

BACKGROUND

Complementary metal-oxide-semiconductor (CMOS) technology is the dominant semiconductor technology used for the manufacture of ultra-large scale integrated (ULSI) circuits today. Size reduction of the metal-oxide-semiconductor field-effect transistor (MOSFET) has provided significant improvement in the speed performance, circuit density, and cost per unit function of semiconductor chips over the past few decades. Significant challenges are faced when CMOS devices are scaled into the sub-100 nm regime. An attractive approach for additional improvement of CMOS transistor performance exploits strain-induced band-structure modification and mobility enhancement to increase the transistor drive current. Enhanced electron and hole mobilities in silicon (Si) under biaxial tensile strain can be achieved. Enhanced electron and hole mobilities improve the drive currents of N-channel and P-channel MOSFETs, respectively.

As shown in FIG. 1a, many designs of strained silicon layers for transistor fabrication utilize thick buffer layers or complex multi-layer structures on a bulk silicon substrate 114. The conventional strained Si substrate technology utilizes a thick silicon-germanium (SiGe) graded buffer layer 110 with thickness in the order of micrometers. Formation of such a thick graded buffer layer 110 typically requires several tens of minutes to several hours and is an expensive process. A relaxed SiGe layer 112 overlies the graded buffer layer 110. The relaxed SiGe layer 112 has a larger natural lattice constant than that of silicon. Relaxed crystalline silicon is said to be lattice-mismatched with respect to relaxed crystalline SiGe due to the difference in their lattice constants. As a result, a thin layer of silicon 116 that is epitaxially grown on the relaxed SiGe layer 112 will be under biaxial tensile strain because the lattice of the thin layer of silicon 116 is forced to align to the lattice of the relaxed crystalline SiGe layer 112 as shown in FIGS. 1b and 1c. A transistor 118 is formed in the silicon layer 116 and 118 includes a source 120, a drain 122 and a gate 124. Transistors fabricated on the strained silicon layer 116 will have enhanced electrical performance.

However, such a substrate might not be easily or economically introduced into a conventional CMOS process. Firstly, the growth of a thick graded SiGe buffer is an expensive and time-consuming process. Secondly, the thick graded buffer layer introduces a lattice mismatch with the underlying substrate, resulting in a disperse, three-dimensional misfit dislocation network. Strain-relieving glide of threading dislocations is facilitated. Dislocations formed in the graded buffer can propagate to the wafer surface, resulting in a defect density in the order of $10^4$–$10^5$ defects per square centimeter. Such a high defect density presents a significant barrier for the production of integrated circuits using such substrates.

Thirdly, the underlying strain fields of the misfit arrays result in a characteristic cross-hatch surface roughness. This surface roughness can be a significant problem as it potentially degrades channel mobility in active devices. In addition, conventional CMOS processes utilize high processing temperatures, especially during the formation of isolation structures. Isolation structures such as shallow trench isolation (STI), local oxidation of silicon (LOCOS), and their variants are in widespread use on bulk substrates today. High temperatures favor the formation of dislocations and increase the defect density. In fact, the defect density in strained silicon substrates has been observed to increase with prolonged annealing at high temperatures. The formation of isolation structures in substrates with a SiGe layer is also challenging as oxides formed on SiGe typically have a high interface state density.

Recently, T. A. Langdo et al., in a paper entitled "Preparation of novel SiGe-free strained Si on insulator substrates," published at the 2002 *IEEE International SOI Conference*, October 2002, pp. 211–212 reported a SiGe-free silicon-on-insulator (SOI) substrate where strained silicon is incorporated. In the work of T. A. Langdo et al., a compositionally graded SiGe layer was grown on a silicon substrate followed by the growth of a relaxed SiGe layer and a tensile-strained silicon layer to form a donor wafer. Hydrogen was implanted into the donor wafer to induce a cleave plane, and the donor wafer was bonded to an oxidized silicon target wafer. A first anneal effects a cleavage along the cleave plane and a second anneal increases the bond strength so that a strained-silicon-on-insulator wafer is formed.

This process suffers from several disadvantages. Firstly, the surface roughness of the strained silicon layer has a root-mean-square value of about five angstroms and may impact device characteristics as well as the strength of bonding between the donor wafer and the target wafer. The high surface roughness of the strained silicon layer is related to the cross-hatch roughness resulting from the growth of the graded SiGe buffer or a lattice-mismatched substrate. Secondly, the strained silicon layer still suffers from high defect density because it overlies a graded SiGe buffer layer where there is an abundance of upward propagating threading dislocations. Therefore, any defects in the strained silicon layer is also transferred to the final strained-silicon-on-insulator wafer.

In the strained-silicon-on-insulator wafer, the strained silicon layer is in direct contact with an insulator layer. By bonding the strained silicon on an insulator layer, the strain in the strained silicon layer is partially relaxed. In the abovementioned paper published by T. A. Langdo et al., the strained silicon layer in the strained-silicon-on-insulator wafer has a strain of about 1%. Based on the germanium content in the relaxed SiGe layer in the donor wafer, the strain in the strained silicon layer should have been about 1.2% if there is no strain relaxation. Therefore, only 83.3% of the maximum possible strain is retained in the strained silicon layer in the final strained-silicon-on-insulator wafer.

SUMMARY OF THE INVENTION

The present invention describes embodiments of an improved method of fabricating strained-silicon-on-insulator substrates.

The preferred embodiment provides a method of forming a strained-silicon-on-insulator substrate is disclosed. A target wafer includes an insulator layer on a substrate. A donor wafer includes a bulk semiconductor substrate having a lattice constant different from a lattice constant of silicon and a strained silicon layer formed on the bulk semiconductor substrate. The top surface of the donor wafer is bonded to the top surface of the target wafer. The strained silicon layer is then separated from the donor wafer so that the strained silicon layer adheres to the target wafer. The bond between the strained silicon layer and the target wafer can then be strengthened.

With the preferred methods, highly manufacturable strained-silicon-on-insulator (SSOI) substrates can be formed. These SSOI substrates can have superior surface roughness comparable to that of bulk substrates. The preferred methods also provide SSOI substrates with extremely low defect density. These advantages can be obtained while retaining the strain in the SSOI substrate.

BRIEF DESCRIPTION OF THE DRAWINGS

For a more complete following descriptions taken in conjunction with the accompanying drawings, in which understanding of the present invention, and the advantages thereof, reference is now made to the:

FIGS. 1b and 1c illustrate the introduction of biaxial strain in the silicon layer of FIG. 1a;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
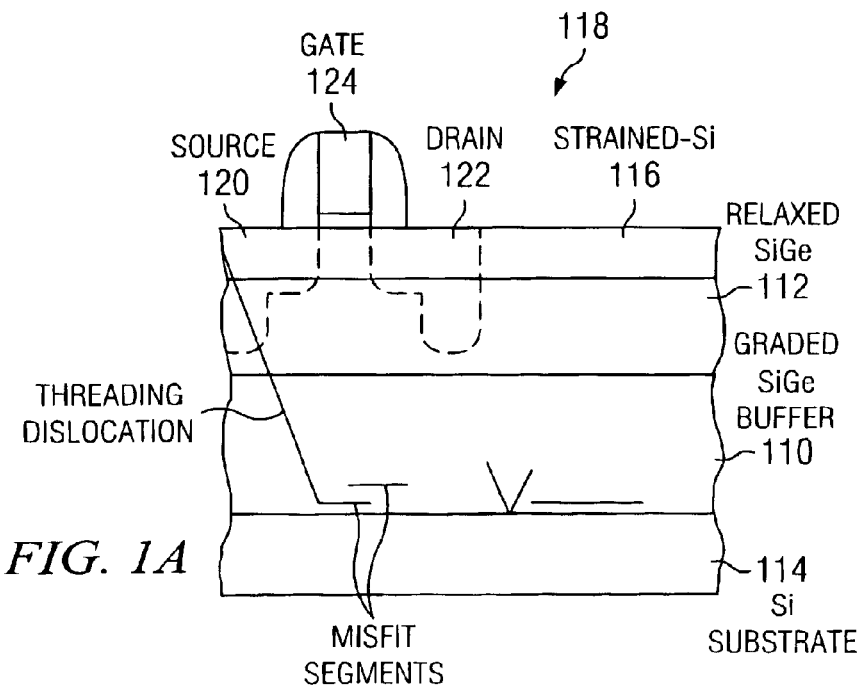
FIG. 1a is a cross-sectional diagram showing a conventional strained silicon technology implemented using a bulk substrate with a thick graded silicon germanium buffer layer.
Figure 1B:
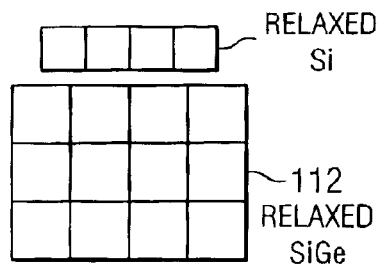
Figure 1C:
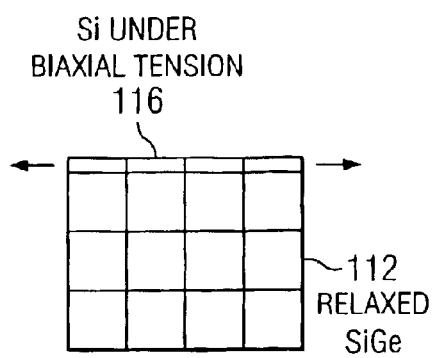
Figure 2A:
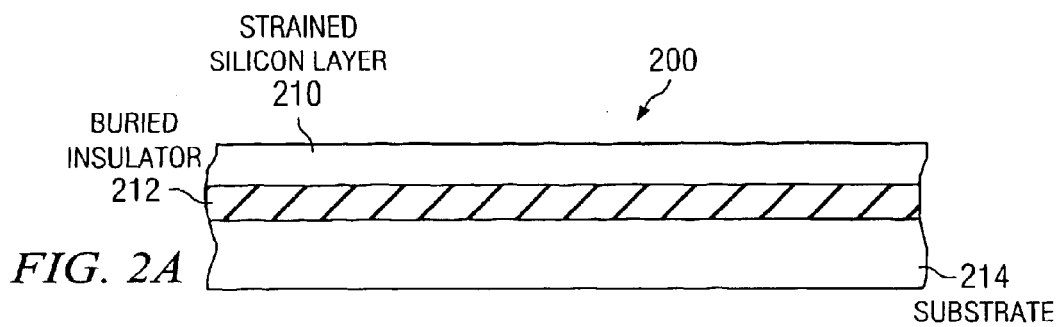
FIGS. 2a and 2b (collectively referred to as FIG. 2) show cross-sections of strained-silicon-on insulator (SSOI) substrates.

FIG. 2a shows a strained-silicon-on-insulator (SSOI) substrate 200 that includes a strained silicon layer 210 overlying a buried insulator layer 212. The buried insulator layer 212 may be comprised of any insulating material. For example, the buried insulator layer 212 may be comprised of insulating materials such as silicon oxide, silicon nitride, and aluminum oxide. In one embodiment, the buried insulator layer 212 is comprised of silicon oxide. The buried insulator may also be a stack comprising of a plurality of insulating material layers such as a silicon nitride layer on a silicon oxide layer, or a silicon oxide on a silicon nitride on a silicon oxide stack, as examples. An example of stacked insulators is shown in FIG. 2b.

In the preferred embodiment, the buried insulator layer 212 includes a high stress layer 212b such as a high stress silicon nitride layer. The high stress layer 212b serves the function of retaining the strain in the strained silicon layer in the strained-silicon-on-insulator wafer. Therefore, the high stress layer 212b is also known as a strain retention layer 212b. By using a high stress layer or strain retention layer 212b in the buried insulator layer 212, the strain in the overlying silicon layer 210 can be better retained or strengthened.

The stress in the high stress layer 212b is preferably larger than 300 mega pascals (MPa). The high stress layer or strain retention layer 212b is comprised of a high stress film such as a high stress nitrogen-containing layer. The high stress nitrogen-containing layer 212b may comprise of silicon nitride $Si_3N_4$, silicon oxynitride $SiO_xN_y$, silicon oxime $SiO_xN_y{:}H_z$, or any combinations thereof. When a high stress film, such as film 212b, is formed on a silicon substrate, the surface of the silicon substrate will be stressed and the lattice constant of the silicon lattice may be altered from its natural lattice constant, i.e., the silicon surface will be under strain. This fact can be utilized to retain or even enhance the strain in the strained silicon layer 210 in the strained-silicon-on-insulator substrate 200 by providing the high stress layer 212b or strain retention layer 212b beneath and in close proximity to the strained silicon layer 210.

Figure 2B:
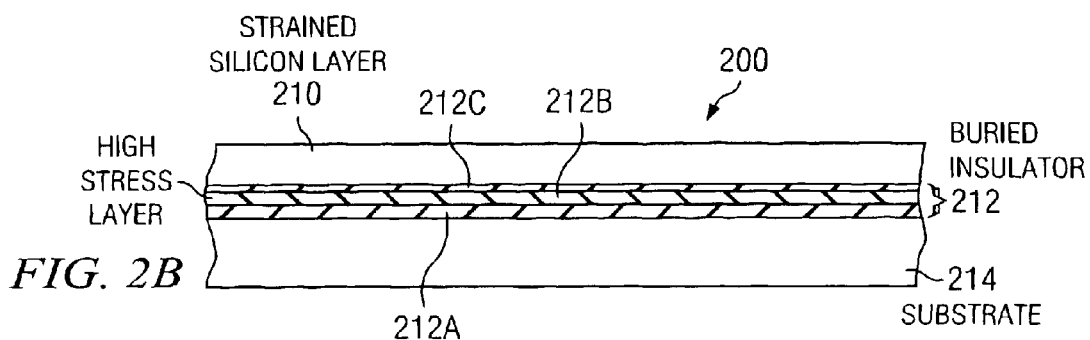

In the embodiment of FIG. 2b, the high stress layer 212b is formed between two other insulating layers 212a and 212c. The three insulators 212a, 212b and 212c combine to form the buried insulator 212. In the preferred embodiment, the insulating layers 212a and 212c are both formed form an oxide such as silicon dioxide. In other embodiments, other materials could be used.

The buried insulator 212 is provided on a substrate 214. The substrate 214 is preferably comprised of silicon. This substrate can be lightly doped, although doping is not necessary. Other materials such as germanium, quartz, sapphire, and glass could alternatively be used as the substrate 214 material.

In the preferred embodiment, the strain in the strained silicon layer 210 is tensile in nature. That is, the lattice constant of the strained silicon layer 210 in the in-plane direction is larger than the lattice constant of silicon in the relaxed state. To better retain the in-plane tensile strain in the strained silicon layer 210, the insulating layer 212 preferably comprises a high-stress, compressively-stressed film. An example of a compressively stressed film is a silicon nitride film with high silicon content deposited by plasma enhanced chemical vapor deposition (PECVD), e.g. by using deposition conditions such as a high ratio of dichlorosilane to ammonia gas flow rates.

In another embodiment, the strain in the strained silicon layer 210 is compressive in nature. That is, the lattice constant of the strained silicon layer is smaller than the lattice constant of silicon in the relaxed state. To better retain the in-plane compressive strain in the strained silicon layer 210, the high stress layer or strain retention layer 212b should preferably be a tensile stressed film. An example of a tensile stressed film is a PECVD deposited silicon nitride film with a high nitrogen content. The stress in the high stress film 212 can be as large as 2 giga pascals (GPa).

Figure 3:
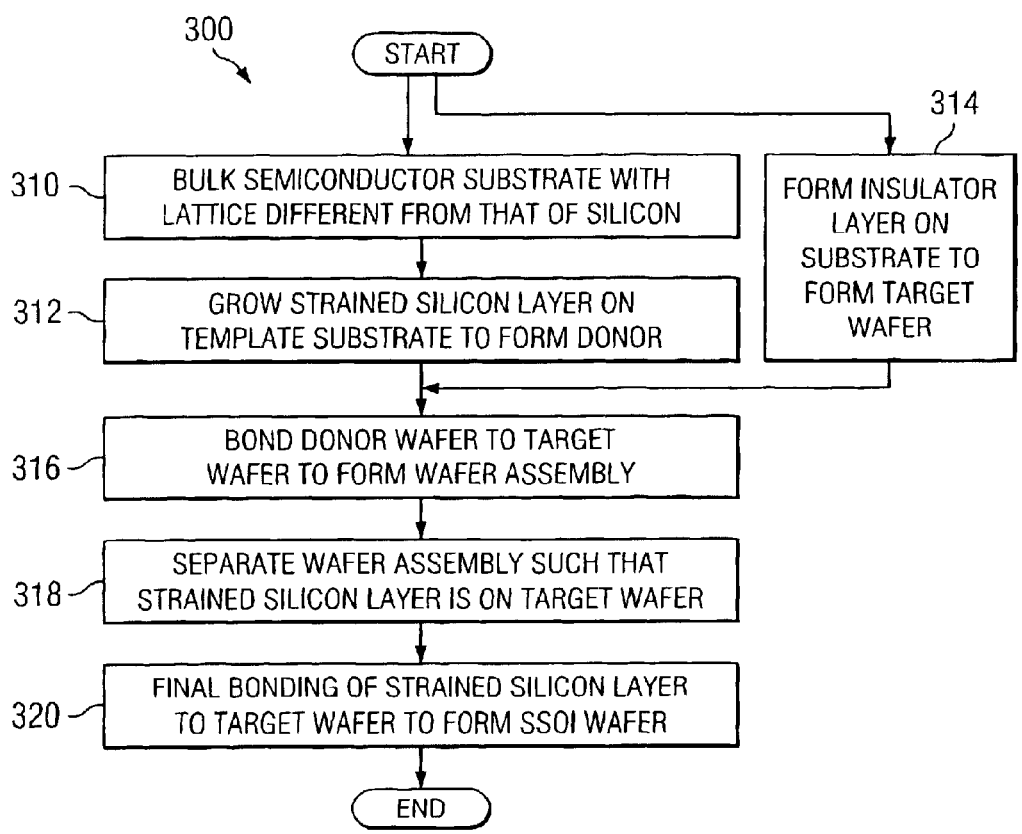
FIG. 3 provides a flowchart of a method of manufacturing a SSOI wafer.

A process flow 300 for the manufacture of a strained-silicon-on-insulator substrate according to a first embodiment of the present invention is illustrated in FIG. 3. In this process, two wafers are initially provided. As shown by block 310, the donor wafer is formed from a bulk substrate (e.g., semiconductor substrate) with a lattice constant different from that of silicon. In block 312, a thin strained silicon layer is epitaxially grown on a bulk semiconductor substrate. It is noted that no graded buffer layer is needed to form a donor wafer.

As shown by block 314, a target wafer is provided by forming an insulator layer on a substrate. For example, in the case of a single layered insulator layer, the insulator can be formed by thermally growing silicon oxide on a silicon substrate. In the case of a stacked insulator layer with a high stress or strain retention layer, the target wafer can be formed by thermally growing silicon oxide on a silicon substrate followed by depositing high stress silicon nitride using a PECVD process. The silicon nitride layer may, in addition, be exposed to an oxidizing ambient to form a thin layer of silicon oxynitride on the top portion of the silicon nitride layer. The high stress layer or strain retention layer preferably comprises a stress of larger than 300 mega pascals (MPa).

The strained silicon layer in the donor wafer can be transferred to the target wafer by a wafer bonding and separation process, as denoted in block 316. As examples, the wafer bonding and separation process can be a Smart-cut™ process, or a Nanocleave™ process, both available from Silicon Genesis Corporation. Details of bonding and separation processes are provided in U.S. Pat. Nos. 5,013,681, 5,374,564, 5,863,830, 6,355,541, 6,368,938, and 6,486,008, each of which is incorporated herein by reference. The separation process is shown by block 318.

If the strained silicon layer is to be comprised of a tensile strain, the bulk substrate of the donor wafer should have a lattice constant larger than that of silicon, e.g., a bulk silicon-germanium (SiGe) wafer. If the strained silicon layer is to be comprised of a compressive strain, the bulk substrate should have a lattice constant smaller than that of silicon, e.g., a bulk silicon-germanium-carbon (SiGeC) wafer. In order for the lattice constant of SiGeC to be smaller than that of silicon, the composition of germanium x and the composition of carbon y in the bulk $Si_{1-x-y}Ge_xC_y$ can be such that $y > 0.1x$.

One motivation of the present invention is that there are relatively less problems with the controllability of surface defect density and surface roughness when dealing with a relaxed bulk semiconductor substrate. For example, it is easier to achieve low defect density and good surface roughness on a bulk SiGe wafer than on a thick graded SiGe buffer layer grown on a Si substrate. In the latter case, lattice mismatch between SiGe and the underlying silicon substrate as well as the growth of the SiGe buffer layer beyond its critical thickness give rise to unavoidable misfit segments, threading dislocations, and high surface roughness. The location and density of the threading dislocations in the graded SiGe buffer layer are not easily controllable.

In contrast, bulk semiconductor substrates have low defect density and surface roughness comparable with that of the state-of-the-art silicon substrates. Therefore, in the donor wafer, strained silicon layers are epitaxially grown on the bulk semiconductor substrates to avoid the aforementioned problems. In this way, low defect density and good surface roughness can be achieved. In addition, in the donor wafer, the strained silicon layer may be epitaxially grown on any bulk substrates with a crystalline surface.

Following wafer separation, an anneal is performed to strengthen the bonding between the strained silicon layer and the target wafer to form the strained-silicon-on-insulator wafer. This final bonding is shown in block 320. The strained silicon layer in the strained-silicon-on-insulator wafer of the preferred embodiment of the present invention is expected to have defect densities of less than 1 defect per square centimeter and root-mean-square surface roughness of less than 2 angstroms, comparable with the state-of-the-art bulk silicon substrates.

Figure 4A:
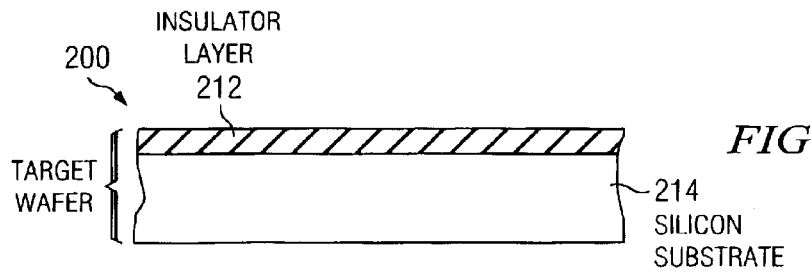
FIGS. 4a–4g show cross-sectional views of a first embodiment process to form an SSOI wafer.

An example of how a substrate of FIG. 2 may be formed is to be described next with respect to FIGS. 4a–4g. Referring now to FIG. 4a, a target wafer 200 includes a substrate 214 (e.g., silicon) and a insulating layer 212 (e.g., oxide, nitride or combinations thereof). In the preferred embodiment, the buried insulator layer 212 includes a high stress layer or strain retention layer (such as was discussed with respect to FIG. 2b). The strain retention layer is preferably a high stress film with a stress of more than 300 MPa, and more preferably a high stress silicon nitride layer with a stress of more than 300 MPa. The target wafer of FIG. 4a may be formed by thermal oxidation of a silicon substrate followed by the deposition of a high stress film such as silicon nitride. The insulator layer may have a thickness in the range of about 100 to about 5000 angstroms.

Figure 4B:
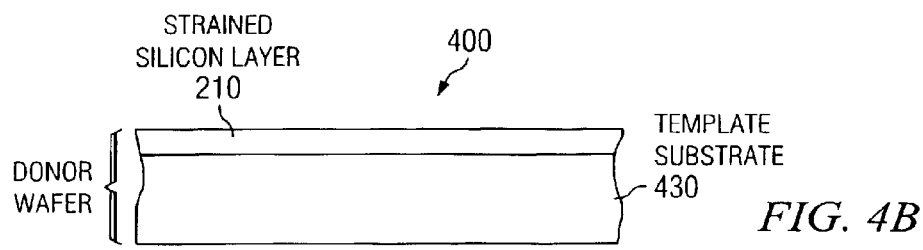
Figure 4C:
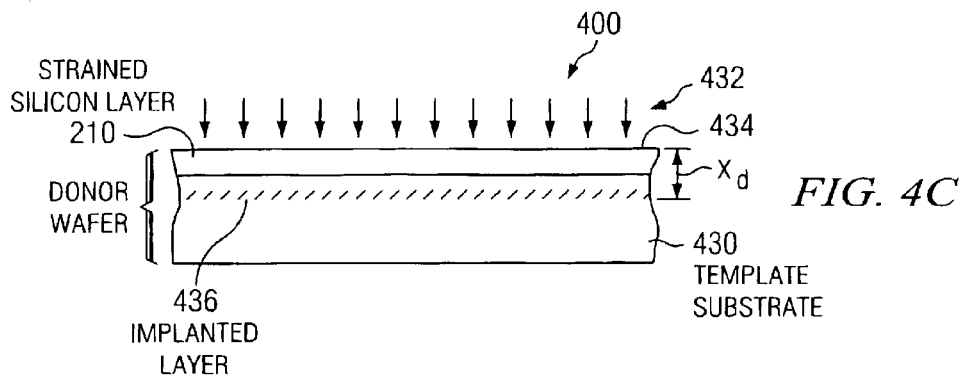

FIGS. 4b and 4c show the formation of the donor wafer 400. A bulk template substrate 430 is provided wherein the template substrate material is in its relaxed state and has a lattice constant different from that of silicon. An epitaxial strained silicon layer 210 is grown on the template substrate 430. The thickness of the strained silicon layer 210 may be in the range of about 20 to about 1000 angstroms. The thickness of the strained silicon layer 210 is preferably kept below its critical thickness, above which it becomes unstable and potentially relax.

The magnitude of the strain $\epsilon$ in the strained silicon layer 210 in the donor wafer 400 may be less than about 4%, and is preferably less than about 2%. The nature of the strain may be compressive or tensile, depending on the template substrate used. If the template substrate 430 is comprised of a material with a lattice constant larger than that of silicon, e.g., $Si_{0.8}Ge_{0.2}$, the strain in the strained silicon layer will be tensile in nature. If the template substrate is comprised of a material with a lattice constant smaller than that of silicon, e.g., $Si_{0.98}C_{0.02}$, the strain in the strained silicon layer will be compressive in nature.

Referring next to FIG. 4c, ions 432 (e.g., of hydrogen or an inert gas selected from a group comprising of helium, argon, neon, krypton, and xenon) are implanted into the donor wafer 400. The peak of the implanted ions is at a depth $x_d$ below the substrate surface 434. The implanted ions result in an implanted layer 436, as shown in FIG. 4b. In the preferred embodiment, the implanted ions are hydrogen ions. The dose of the implanted ions may be approximately $10^{15}$ cm$^{-2}$. The implantation energy depends on the desired implant depth, and may generally range from about 1 keV to about 500 keV. The ions may be implanted by a variety of techniques, including beam line ion implantation, plasma immersion ion implantation (PIII) or ion shower. Hydrogen ions are desirable because they easily travel through the substrate material to the selected depth without substantially damaging the material.

Figure 4D:
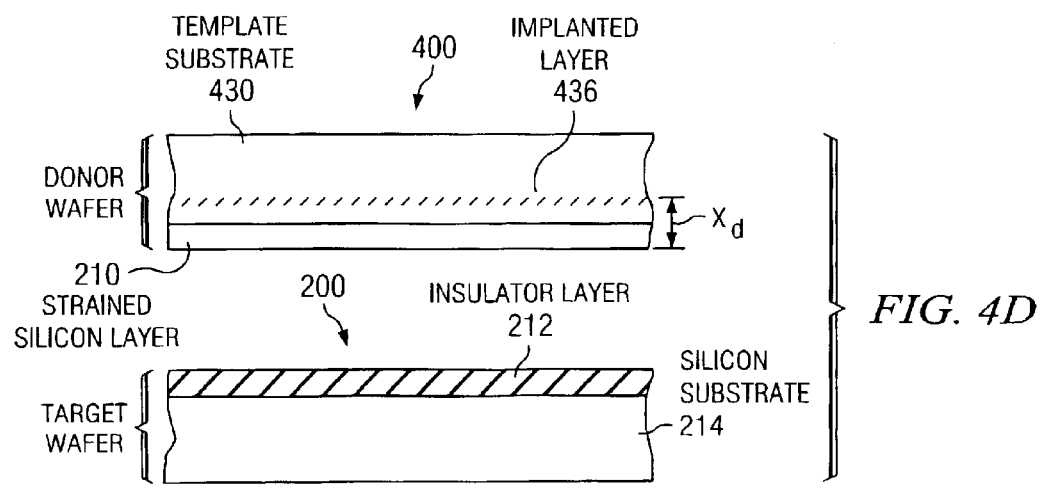
Figure 4E:
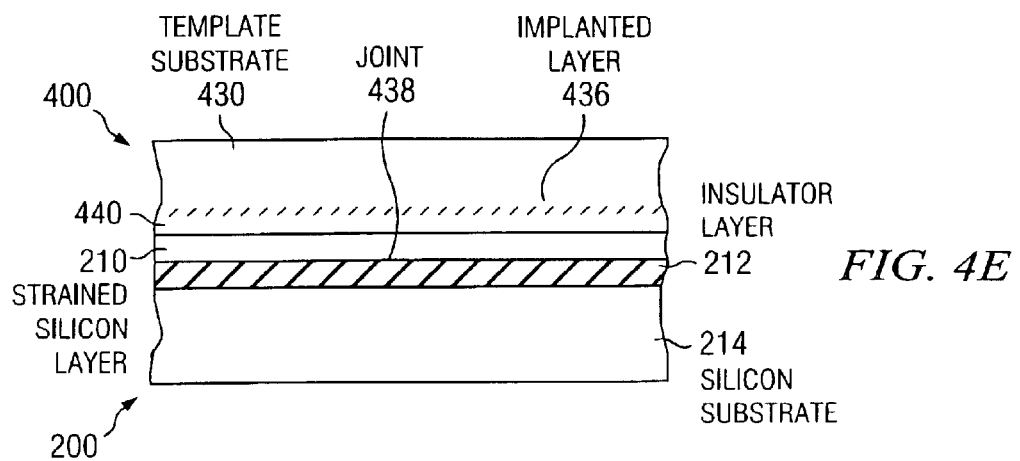

The next process step is the bonding of the top surface (i.e., the surface of the strained silicon layer 210) of the donor wafer 400 to the top surface (i.e., the surface of the insulator layer 212) of the target wafer 200. This is illustrated in FIGS. 4d and 4e. The bonding process may be a beta bonding process, such as one known and used in the art. Beta bonding is a bonding process that joins the donor wafer 400 and the target wafer 200 together. It is believed that beta bonding arises from electrostatic or van der Waals forces.

Beta bonding produces a joint 438 between the donor wafer 400 and the target wafer 200. The target wafer 200 will act as a mechanical support for the transferred thin film that includes the strained silicon layer 210 when it is separated from the donor wafer 400. A portion 440 of the template substrate 430 may be transferred with the strained silicon layer 210 to the target wafer 200. This transferred template substrate material 440 may be selectively removed. Prior to beta bonding, the surfaces of the wafers 200 and 400 to be bonded are preferably cleaned to remove any residual liquids or particles from the wafer surfaces.

The bonding process forms a wafer assembly, as shown in FIG. 4e. According to a preferred embodiment of this invention, the strained silicon layer 210 in the wafer assembly is sandwiched between two stressors, or stress-inducing agents. One stressor is the template substrate 430 which induces strain in the strained silicon layer due to the lattice mismatch between the strained silicon layer 210 and the template substrate 430. The second stressor is the high stress layer or strain retention layer in the buried insulator 212 that is in close proximity to the strained silicon layer 210. Therefore, the strain in the strained silicon layer 210 may be better retained or strengthened as compared to other techniques of forming the SSOI substrate.

The wafer assembly is then separated at the position of the implanted layer 436 using a wafer separation process. For example, the wafer separation process can be initiated by a heat treatment. When the temperature of the wafer assembly rises above a certain level, e.g., about 500 degrees Celsius, microbubbles formed in the implanted layer expand and pressure builds up. When the pressure in the microbubbles exceeds a certain value, the donor wafer will split off along a cleavage plane. One method of performing this controlled cleaving process is known as a SmartCut™ process, from Silicon Genesis Corporation. It is believed that crystalline rearrangement and coalescence of microbubbles occurs to form macrobubbles with sufficient kinetics to separate the thin film from the donor wafer.

Figure 4F:
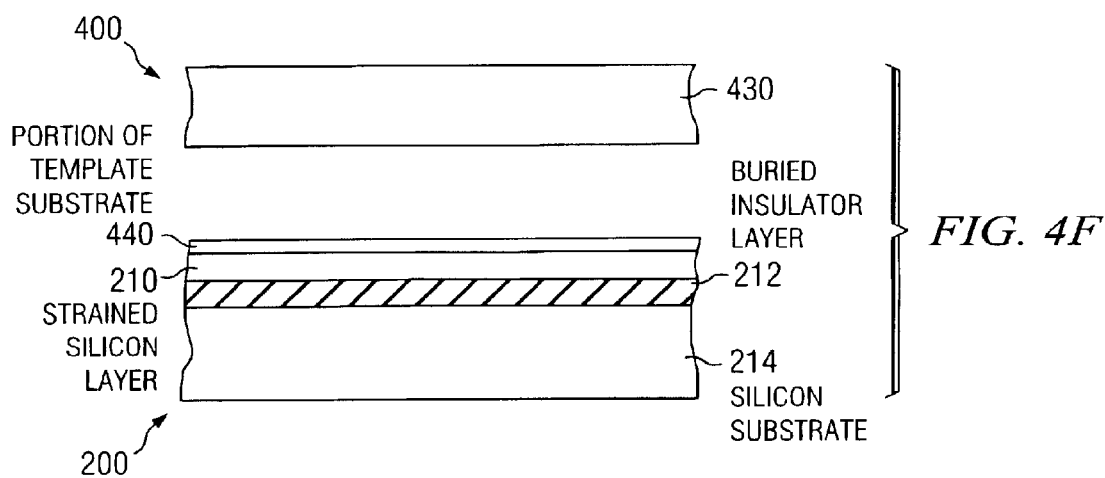

One of the separated wafers is a reusable template substrate 400. The other separated wafer is a strained silicon-on-insulator (SSOI) substrate 200 with a portion 440 of the template substrate overlying the strained silicon layer 210, as shown in FIG. 4f. The portion 440 of the template substrate on the strained silicon layer 210 can be etched away.

Figure 4G:
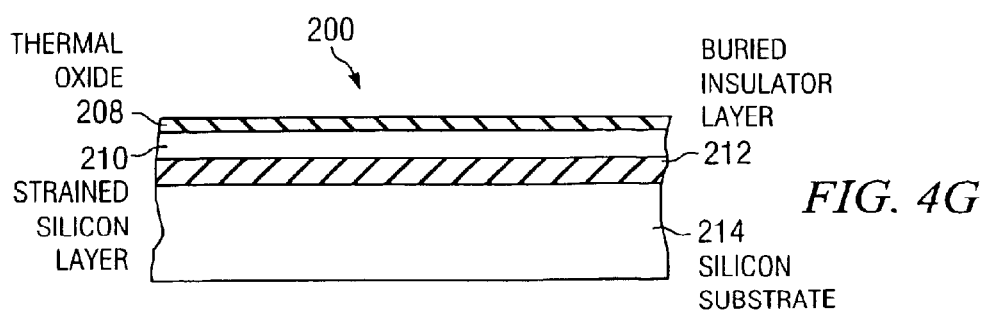

Subsequently, final bonding between the thin film 210 and the target wafer 200 is performed to yield the desired strained-silicon-on-insulator (SSOI) substrate. This finally bonding step is usually performed with a high temperature anneal, where the annealing temperature is typically above 700 degrees Celsius. The final bonding step creates a strong bond between the thin film of strained silicon 210 and the target wafer 200. It is believed that covalent bonds are form at the joint when the wafer is anneal at a sufficiently high temperature for a sufficient period of time. During the annealing, a layer of thermal oxide 208 may be grown on the strained silicon surface, as shown in FIG. 4g. The thermal oxide layer 208 may be removed, e.g., by a wet etch in dilute hydrofluoric acid. In the preferred embodiment, the strained silicon layer 210 in the strained-silicon-on-insulator wafer 200 as shown in FIG. 4g has a strain that is at least 90% of the strain in the strained silicon layer 210 in the donor wafer 400 of FIG. 4c.

Figure 5A:
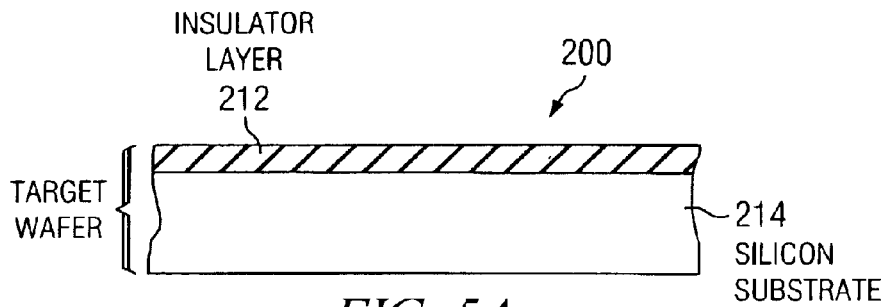
FIG. 5a shows a target wafer and FIG. 5b shows a donor wafer that can be combined to form the SSOI substrate of FIG. 2.
Figure 5B:
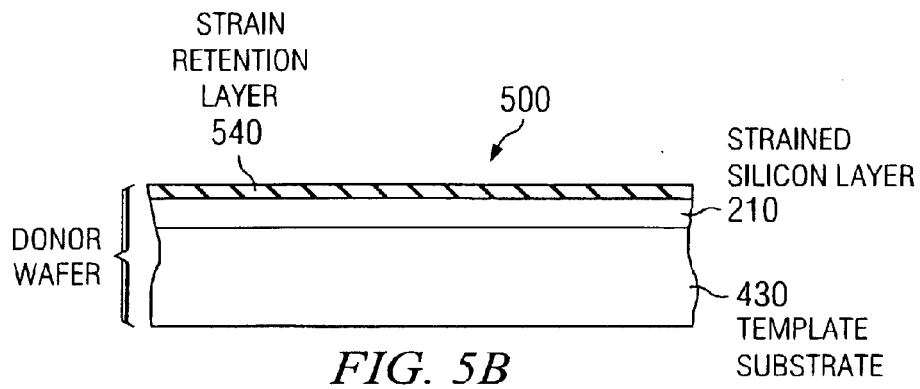

Several other combinations of donor and target wafers in the wafer bonding and wafer separation technique as described previously may result in the formation of substrates similar to those of FIG. 2. One example is shown in FIGS. 5a and 5b. In this example, the target wafer 200 is the same as that shown in FIG. 4a, i.e., comprising of an insulator layer 212 on a substrate 214. Once again, the insulator 212 may be silicon oxide and the substrate 214 may be a silicon substrate.

The donor wafer 500 may comprise a strain retention layer 540 formed on a strained silicon layer 210 that is epitaxially grown on a template substrate 430. The strain retention layer 540 on the strained silicon layer 212 may be deposited by a chemical vapor deposition process. Bonding the top surfaces of the target and donor wafers 200 and 400 of FIG. 5 involves the bonding of the strain retention layer 540 on the donor wafer 400 to the insulator layer 212 on the target wafer 200.

It is understood that the buried insulator layer 212 may be a stack comprising of a plurality of dielectric layers. For example, it may be a high stress silicon nitride on silicon oxide stack. Such a substrate may be formed by incorporating the stack in the target wafer 200, e.g., using a target wafer with an insulator layer comprising of a high stress silicon nitride layer on a silicon oxide layer. In another example, the buried insulator layer may also be a high stress silicon nitride layer with a stress larger than 300 MPa overlying a low stress silicon nitride layer with a stress smaller than 300 MPa.

The preceding description relates to methods of manufacturing strained-silicon-on-insulator substrates using a wafer bonding and separation method where an implantation was employed to induce a cleave plane. In those cases, the wafer separation is initiated by a heat treatment. According to another method embodiment of this invention, the donor wafer may depend on other mechanisms to initiate the cleavage process for wafer separation. For example, the wafer separation process may be an atomic layer cleaving process or nanocleave process as described by Michael I. Current et al., "Atomic layer cleaving with SiGe strain layers for fabrication of Si and Ge-rich SOI device layers," Proceeding of 2001 IEEE International SOI Conference, October 2001, pp. 11–12, which paper is incorporated herein by reference. The nanocleave transfer process results in a layer separation using a strain-layer cleave plane.

Figure 6A:
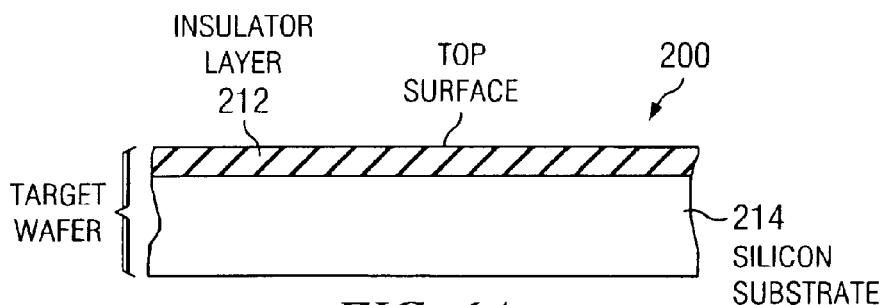
FIGS. 6a–6e show cross-sectional views of a second embodiment process to form an SSOI wafer.

Referring now to FIGS. 6a–6e, another method of manufacturing a strained-silicon-on-insulator (SSOI) substrate is described. In this embodiment, a target wafer 200 as shown in FIG. 6a is provided which comprises of an insulator layer 212 overlying a substrate 214. As before, the insulator layer 212 preferably includes a high stress layer or strain retention layer. The high stress layer or strain retention layer has a stress of more than 300 MPa.

Figure 6B:
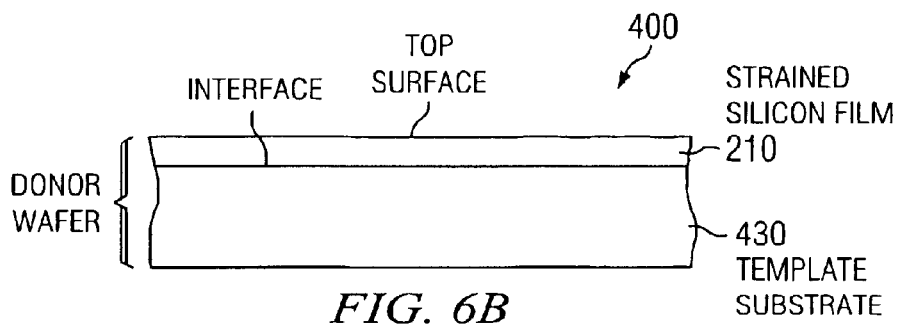

A donor wafer 400, as shown in FIG. 6b, is provided. The donor wafer 400 comprises of a strained-silicon layer 210 on a relaxed template substrate 430. The thickness of the strained silicon layer 210 is preferably less than about 1000 angstroms and the strain may vary from about 0.01% to about 4%. The template substrate 430 may be a bulk SiGe substrate or a $Si_{1-x-y}Ge_xC_y$ substrate as previously described. There is an interface between the strained silicon layer 210 and the relaxed template substrate 430. A large strain gradient exists across this interface. The strained silicon layer may be epitaxially grown using chemical vapor deposition.

Figure 6C:
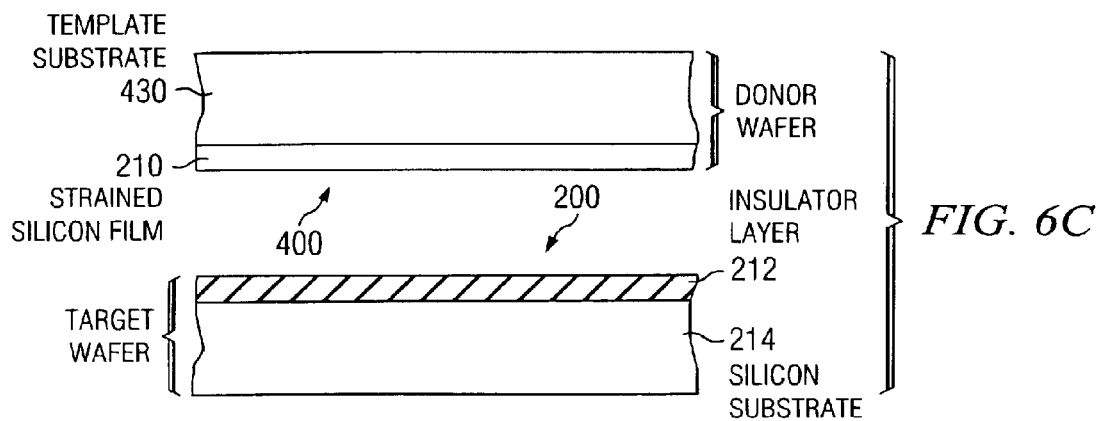
Figure 6D:
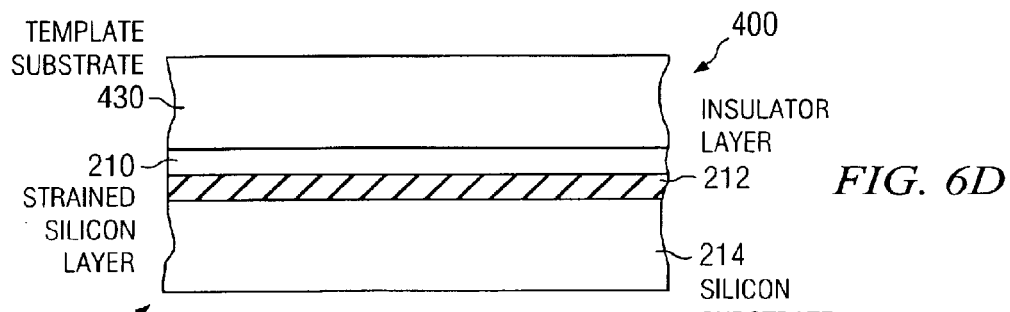

Next, the top surface of the donor wafer 400 is bonded to the top surface of the target wafer 200. The wafer bonding process is illustrated in FIG. 6c and the resulting wafer assembly is schematically shown in FIG. 6d. A cut or cleave can be made at or near the interface between the strained silicon layer 210 and the template substrate 430 using a process similar to the nanocleave process. The cleave plane will be initiated near the interface between the strained silicon layer 210 and the template substrate 430.

If the cleave plane is in the template substrate material, some template substrate 430 material will overlie the strained silicon layer 210 in the silicon-on-insulator substrate 200. This material can be removed by an etch process (not shown). If the cleave plane is in the strained silicon layer 210, the reclaimed template substrate 430 will have a thin layer of strained silicon on it (not shown). This silicon layer can be removed if the substrate 430 is to be re-used.

Figure 6E:
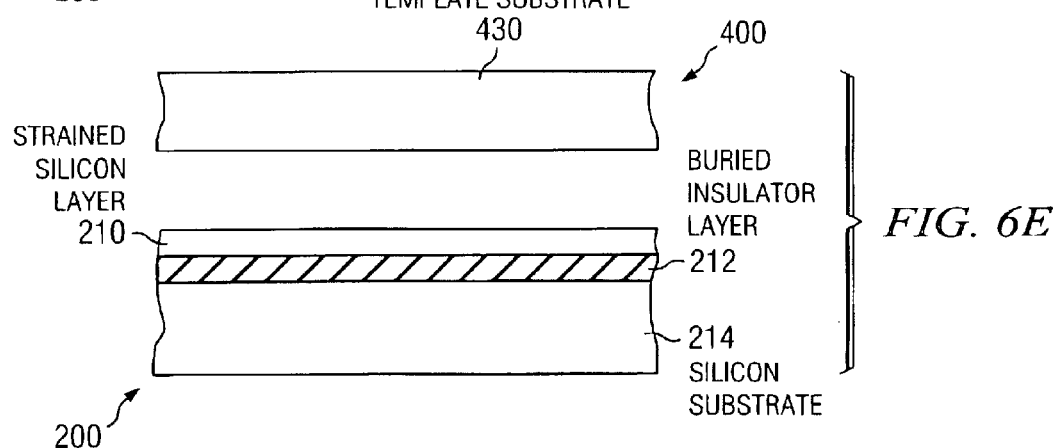

Following the wafer separation process, final bonding between the strained silicon layer 210 and the target wafer 200 is performed to yield the desired recess-resistant SOI substrate. This usually require a high temperature anneal, where the annealing temperature is typically above about 700 degrees Celsius. This results in the formation of a strained-Si layer on insulator structure as illustrated in FIG. 6e. The wafer 400 is the template substrate and can be reclaimed and reused.

It will be appreciated that the strained-silicon-on-insulator substrate may be manufactured by the above wafer bonding and wafer separation method using other combinations of donor and target wafers. For example, the donor wafer may have a silicon oxide overlying the strained silicon layer, or a silicon nitride on a silicon oxide stack overlying the strained silicon layer.

It will also be appreciated that the strained semiconductor layer can be a material other than silicon. For example, the present invention could be used to form strained layers of germanium, gallium arsenide or other semiconductors. In another variation, the donor wafer could comprise a wafer with layers formed on the surface. For example, the donor wafer could comprise a silicon substrate with a SiGeC or SiC layer formed on the surface.

Figure 7:
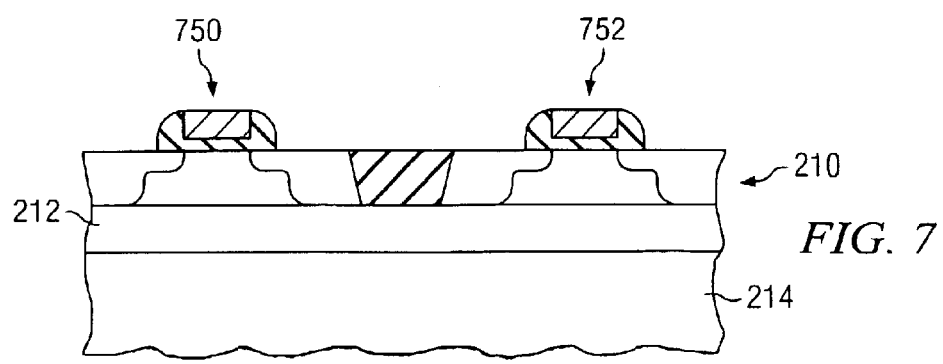
FIG. 7 illustrates the formation of CMOS transistors in a strained silicon layer according to the present invention.

FIG. 7 shows an example of circuitry formed in a SSOI substrate of the present invention. In this example, CMOS transistors 750 and 752 can be formed in strained silicon layer 210. In the case of CMOS, the portion of layer 210 that includes NMOS transistor 750 will be lightly doped with p-type dopants (e.g., boron) and the portion of layer 210 that includes PMOS transistor 752 will be lightly doped with n-type dopants (e.g., arsenic and/or phosphorus). Each transistor includes a gate 754 that insulatively overlies a channel region 756. Source 758 and drain 760 regions are separated by the channel region 756. FIG. 7 is intended be an illustrative example of one of the many types of devices that can be formed in a strained silicon layer. Many other devices can also be formed.

The scope of the present application is not intended to be limited to the particular embodiments of the circuit, process, machine, manufacture, means, methods and steps described in the specification. As one of ordinary skill in the art will readily appreciate from the disclosure of the present invention, circuits, components, processes, machines, manufacture, means, methods, or steps, presently existing or later to be developed, that perform substantially the same function or achieve substantially the same result as the corresponding embodiments described herein may be utilized according to the present invention. Accordingly, the appended claims are intended to include within their scope such circuits, components, processes, machines, manufacture, means, methods, or steps.

What is claimed is:

1. A method of forming a strained-silicon-on-insulator substrate comprising the steps of:
   providing a bulk semiconductor substrate, the bulk semiconductor substrate having a lattice constant different from a lattice constant of silicon;
   forming a strained silicon layer on the bulk semiconductor substrate to form a donor wafer, the donor wafer having a top surface;
   implanting ions into the donor wafer to form an implanted layer;
   providing a target wafer comprising of an insulator layer overlying a substrate, the insulator layer comprising a high stress layer, the target wafer having a top surface;
   bonding the top surface of the donor wafer to the top surface of the target wafer;
   separating the strained silicon layer from the donor wafer, the strained silicon layer adhering to the target wafer; and
   strengthening the bond between the strained silicon layer and the target wafer.

2. The method of claim 1 wherein the insulator layer comprises a high stress layer that has a stress of more than 300 MPa.

3. The method of claim 1 wherein the lattice constant of the bulk semiconductor substrate is larger than the lattice constant of silicon.

4. The method of claim 3 wherein the bulk semiconductor substrate is a bulk silicon-germanium substrate.

5. The method of claim 1 wherein the high stress layer is a nitrogen-containing layer.

6. The method of claim 5 wherein the nitrogen-containing layer is selected from a group of consisting of silicon nitride, silicon oxynitride, silicon oxime, and any combinations thereof.

7. The method of claim 5 wherein the nitrogen-containing layer comprises Si3N4.

8. The method of claim 1 wherein the strained silicon layer is under tensile strain.

9. The method of claim 8 wherein the tensile strain has a magnitude of between about 0.01% and about 4%.

10. The method of claim 1 wherein the said lattice constant of the bulk semiconductor substrate is smaller than the lattice constant of silicon.

11. The method of claim 10 wherein the bulk semiconductor substrate is a bulk silicon-germanium-carbon substrate.

12. The method of claim 1 wherein the strained silicon layer is under compressive strain.

13. The method of claim 12 wherein the compressive strain has a magnitude of between about 0.01% and about 4%.

14. The method of claim 1 wherein the implanted ion species is selected from a group consisting of helium, neon, argon, krypton, xenon, and combinations thereof.

15. The method of claim 1 wherein the insulator layer comprises silicon oxide.

16. The method of claim 1 wherein the insulator layer has a thickness of between about 100 angstroms and about 5000 angstroms.

17. The method of claim 1 wherein the target wafer substrate comprises a silicon substrate.

18. The method of claim 1 wherein the donor wafer further comprises a dielectric layer on the strained silicon layer.

19. The method of claim 18 wherein the dielectric layer is comprised of a material selected from a group consisting of silicon oxide, silicon nitride, silicon oxynitride, aluminum oxide and combinations thereof.

20. The method of claim 18 wherein the dielectric layer is a high stress layer with a stress of more than 300 Mpa.

21. The method of claim 1 wherein the bonding process comprises a beta-bonding process.

22. The method of claim 1 wherein the separating process comprises a controlled cleaving process.

23. The method of claim 1 wherein strengthening the bond comprises annealing the strained silicon layer and the target substrate.

24. A method of forming a strained-silicon-on-insulator substrate comprising the steps of:
   providing a bulk semiconductor substrate, the bulk semiconductor substrate having a lattice constant different from a lattice constant of silicon;
   providing a strained silicon layer on the bulk semiconductor substrate to form a donor wafer, the donor wafer having a top surface and an interface between the strained silicon layer and the bulk semiconductor substrate;
   providing a target wafer comprising an insulator layer overlying a substrate, the insulator layer comprising a high stress layer and said target wafer having a top surface;
   bonding the top surface of the donor wafer to the top surface of the target wafer;
   separating the strained silicon layer from the donor wafer, the strained silicon layer adhering to the target wafer; and
   strengthening the bond between the strained silicon layer and the target wafer.

25. The method of claim 24 wherein the insulator layer comprises a high stress layer that has a stress of more than 300 MPa.

26. The method of claim 24 wherein the said lattice constant of the bulk semiconductor substrate is larger than the lattice constant of silicon.

27. The method of claim 26 wherein the bulk semiconductor substrate comprises a bulk silicon-germanium substrate.

28. The method of claim 24 wherein the high stress layer comprises a nitrogen-containing layer.

29. The method of claim 28 wherein the nitrogen-containing layer is selected from a group consisting of silicon nitride, silicon oxynitride, silicon oxime, and any combinations thereof.

30. The method of claim 28 wherein the nitrogen-containing layer comprises Si3N4.

31. The method of claim 24 wherein the strained silicon film is under tensile strain.

32. The method of claim 31 wherein the tensile strain has a magnitude of between about 0.01% and about 4%.

33. The method of claim 24 wherein the said lattice constant of the bulk semiconductor substrate is smaller than the lattice constant of silicon.

34. The method of claim 33 wherein the bulk semiconductor substrate is a bulk silicon-germanium-carbon substrate.

35. The method of claim 24 wherein the strained silicon film is under compressive strain.

36. The method of claim 35 wherein the compressive strain has a magnitude of between about 0.01% and about 4%.

37. The method of claim 24 wherein the insulator layer comprises of silicon oxide.

38. The method of claim 24 wherein the insulator layer has a thickness of between about 100 angstroms and about 5000 angstroms.

39. The method of claim 24 wherein the target wafer substrate comprises a silicon substrate.

40. The method of claim 24 wherein the donor wafer further comprises a dielectric layer on the strained silicon layer.

41. The method of claim 40 wherein the dielectric layer is comprised of a material selected from a group consisting of silicon oxide, silicon nitride, silicon oxynitride, aluminum oxide, and combinations thereof.

42. The method of claim 40 wherein the dielectric layer is a high stress layer with a stress of more than 300 MPa.

43. The method of claim 24 wherein said bonding process comprises a beta-bonding process.

44. The method of claim 24 wherein said separating process comprises an atomic layer cleaving process.

45. The method of claim 24 wherein said the bond between the semiconductor film and the target wafer is strengthened by annealing the hybrid wafer.

46. A method of forming a strained-semiconductor-on-insulator semiconductor device, the method comprising:
   providing target wafer that includes a substrate with a high stress layer formed thereon;
   adhering a donor wafer to a surface of the target wafer, the donor wafer including a bulk substrate and a strained semiconductor layer disposed over the bulk substrate; and
   separating the strained semiconductor layer from the donor wafer, the strained semiconductor layer adhering to the target wafer.

47. The method of claim 46 wherein the strained semiconductor layer comprises a strained silicon layer.

48. The method of claim 47 wherein the bulk substrate has a lattice constant different from the lattice constant of silicon.

49. The method of claim 46 wherein providing a target wafer comprises proving a silicon wafer and wherein the high stress layer comprises a first oxide layer formed over the silicon wafer, a nitride layer formed over the first oxide layer and a second oxide layer formed over the nitride layer.

50. The method of claim 46 wherein the high stress layer comprises an insulating layer.

51. The method of claim 50 wherein the insulating layer comprises a nitrogen-containing layer.

52. The method of claim 46 wherein the donor wafer comprises a doped region, wherein the strained semiconductor layer is separated from the donor wafer at the doped region.

53. The method of claim 52 wherein the doped region comprises a hydrogen doped region.

54. The method of claim 52 wherein the doped region comprises a region doped with a material selected from the group consisting of helium, neon, argon, krypton, xenon, and combinations thereof.

55. The method of claim 46 and further comprising strengthening the bond between the strained semiconductor layer and the target wafer after adhering the strained semiconductor layer to the target wafer.

56. The method of claim 55 wherein strengthening the bond comprises heating the strained semiconductor layer and the target wafer to a temperature greater than about 700° C.

57. A method of forming a strained silicon on insulator (SSOI) device, the method comprising:
   providing a strained silicon layer between a first stressor layer and a second stressor layer, the first stressor layer adjacent a first surface of the strained silicon layer and the second stressor layer adjacent a second surface of the strained silicon layer, the second surface being opposed to the first surface; and
   removing the first stressor layer.

58. The method of claim 57 wherein the second stressor layer comprises a nitrogen-containing layer.

59. The method of claim 58 wherein the nitrogen-containing layer is formed over an oxide layer, the oxide layer being formed over a substrate.

60. The method of claim 57 wherein the first stressor layer comprises a silicon germanium layer.

61. The method of claim 60 wherein the first stressor layer comprises a SiGeC layer.

62. The method of claim 60 wherein the first stressor is a crystalline material.

63. The method of claim 57 wherein providing a strained silicon layer between a first stressor layer and a second stressor layer comprises bonding a donor wafer to a target wafer, the donor wafer including the first stressor layer and the target layer comprising the second stressor layer and the strained silicon layer.

64. The method of claim 57 wherein the first stressor layer abuts the first surface prior to removing.

65. The method of claim 1 wherein the insulator layer comprises a first oxide layer formed over the substrate, a nitride layer formed on the first oxide layer and a second oxide layer formed on the nitride layer.

66. The method of claim 1 wherein the implanted ion species comprises hydrogen.

67. The method of claim 1 wherein providing target wafer comprising of an insulator layer overlying a substrate comprises:

providing the substrate; and depositing a high stress film on the substrate.

68. The method of claim 67 wherein providing the substrate comprises providing a silicon substrate and wherein depositing a high stress film comprises depositing a silicon nitride film with high silicon content by plasma enhanced chemical vapor deposition.

69. The method of claim 68 wherein depositing a silicon nitride film comprises using deposition conditions that include a high ratio of dichlorosilane to ammonia gas flow rates.

70. The method of claim 67 wherein depositing a high stress film comprises depositing a silicon nitride film with a high nitrogen content.

71. A method of forming a strained-semiconductor-on-insulator semiconductor device, the method comprising:

providing target wafer that includes a substrate with a multi-layer insulator formed thereon, the multi-layer insulator comprising a first oxide layer formed over the substrate, a nitride layer formed over the first oxide layer and a second oxide layer formed over the nitride layer;

adhering a donor wafer to a surface of the target wafer, the donor wafer including a bulk substrate and a strained semiconductor layer disposed over the bulk substrate; and separating the strained semiconductor layer from the donor wafer, the strained semiconductor layer adhering to the target wafer.

72. The method of claim 71 wherein the donor wafer comprises a doped region, wherein the strained semiconductor layer is separated from the donor wafer at the doped region and wherein the doped region comprises a hydrogen doped region.

73. The method of claim 71 and further comprising strengthening the bond between the strained semiconductor layer and the target wafer after adhering the strained semiconductor layer to the target wafer, wherein strengthening the bond comprises heating the strained semiconductor layer and the target wafer to a temperature greater than about 700° C.

74. A method of forming a strained-semiconductor-on-insulator semiconductor device, the method comprising:

providing a target wafer that includes a substrate with an insulating layer formed thereon, the insulating layer comprising first oxide layer formed over the substrate, a nitride layer formed over the first oxide layer and a second oxide layer formed over the nitride layer;

adhering a donor wafer to a surface of the target wafer, the donor wafer including a bulk substrate and a strained semiconductor layer disposed over the bulk substrate; and separating the strained semiconductor layer from the donor wafer, the strained semiconductor layer adhering to the target wafer.

75. The method of claim 74 wherein the strained semiconductor layer comprises a strained silicon layer.

76. The method of claim 75 wherein the bulk substrate has a lattice constant different from the lattice constant of silicon.

77. The method of claim 74 wherein the donor wafer comprises a doped region, wherein the strained semiconductor layer is separated from the donor wafer at the doped region.

78. The method of claim 77 wherein the doped region comprises a hydrogen doped region.

79. The method of claim 77 wherein the doped region comprises a region doped with a material selected from the group consisting of helium, neon, argon, krypton, xenon, and combinations thereof.

80. The method of claim 74 and further comprising strengthening the bond between the strained semiconductor layer and the target wafer after adhering the strained semiconductor layer to the target wafer.

81. The method of claim 80 wherein strengthening the bond comprises heating the strained semiconductor layer and the target wafer to a temperature greater than about 700° C.

82. The method of claim 71 wherein the nitride layer comprises a high stress layer.

83. The method of claim 74 wherein the nitride layer comprises a high stress layer.

84. The method of claim 83 wherein the nitride layer has a stress of more than 300 MPa.

* * * * *